July 2, 1968 M. FISCHMAN 3,391,353

SQUARE-WAVE OSCILLATOR WITH THREE-TERMINAL RESONANT CIRCUIT

Filed Jan. 3, 1967

INVENTOR.
MARTIN FISCHMAN

BY R. J. Frank
ATTORNEY.

United States Patent Office 3,391,353

Patented July 2, 1968

3,391,353
SQUARE-WAVE OSCILLATOR WITH THREE-TERMINAL RESONANT CIRCUIT

Martin Fischman, Wantagh, N.Y., assignor to General Telephone & Electronics Laboratories Incorporated, a corporation of Delaware Filed Jan. 3, 1967, Ser. No. 606,899
9 Claims. (Cl. 331—117)

ABSTRACT OF THE DISCLOSURE

A square-wave oscillator having an inductance-capacitance resonant circuit in the feedback circuit to stabilize the frequency of the output signal is disclosed. A transistor, operated as a low impedance switch at the oscillator frequency, is connected in series with the resonant circuit to minimize the loading of the resonant circuit and provide an increased Q. First and second diodes are coupled to the terminals of the resonant circuit and poled to provide low impedance series conducting paths during the period that the transistor is nonconductive.

*Background of the invention*

The invention relates to oscillators having a square-wave output signal and, in particular, to a square-wave oscillator employing an inductance-capacitance (LC) type resonant circuit in the oscillator feedback circuit.

Oscillators designed to generate square-wave output signals having steep leading and trailing edges find wide application in television and other electronic apparatus. These known oscillators are generally of the relaxation type in which the frequency is determined by resistance-capacitance (RC) or resistance-inductance (RL) networks. However, it has been found that relatively wide frequency variations occur in relaxation oscillators with changes in supply voltage, transistor characteristics, or the loading of the frequency-determining networks and that these variations make them unsatisfactory for many applications requiring high frequency stability.

A second type of square-wave oscillator utilizes an L-C type resonant circuit to obtain improved frequency stability. Typical examples of this type of oscillator are known in the art as the Hartley, Colpitts, and Clapp configurations. In these known configurations, the base-emitter junction of the transistor employed therein is connected in shunt or parallel with the resonant circuit. The shunt connection results in a loading of the resonant circuit dut to the low impedance of the base-emitter junction and a corresponding decrease in the Q of the resonant circuit. (The Q of a resonant circuit is a measure of the efficiency of the circuit and is generally expressed as a function of the ratio of the energy dissipated per unit time to the energy stored in the circuit per unit time. In addition, the Q of the resonant circuit determines the magnitude of the resonant circuit current and voltages.) Since the resonant circuit of these oscillators provides the feedback signal to the base of the transistor, the magnitude and time rate of change of the feedback signal determines the time required to render the switch fully conductive. The time required to drive the transistor from its nonconductive to fully conductive state determines the shape of the leading and trailing edges of the square-wave output signal. To generate square-wave output signals having steep waveform edges, the loading of the resonant circuit should be minimized and the Q of the circuit maximized.

*Summary of the invention*

The present invention comprises a square-wave oscillator in which a semiconductor switching element is coupled electrically in series with an inductance-capacitance resonant circuit. The switching element, typically a transistor, is provided with first, second and third electrodes. The second electrode is the control electrode and the application of a first polarity signal thereto renders the element conductive whereby a low impedance path is provided between the first, second, and third electrodes. The resonant circuit is provided with first, second and third terminals. The first and third terminals are coupled to the third and second electrodes, respectively, of the switching element. The first electrode of the switching element and the second terminal of the resonant circuit are coupled to a reference potential, i.e. ground.

The resonant circuit provides a 180 degrees phase shift between voltages appearing at its first and third terminals. In addition, the presence of a first polarity signal at the third terminal renders the switching element conductive. Consequently, a low impedance path is provided from both the first and third resonant circuit terminals through the switching element to the reference potential. When the switching element is in its conductive or low impedance state, it is in electrical series with the first to second terminal and second to third terminal portions of the resonant circuit.

The first electrode of a first diode is coupled to the second electrode of the switching element. The diode is poled to provide a low impedance path for second polarity signals appearing at its first electrode. The second electrode of the first diode is coupled to the reference potential. Thus, a low impedance path is provided between the third terminal of the resonant circuit and the reference potential when the switching element is in a nonconductive state. In addition, the third electrode of the switching element is coupled to the second electrode of a second diode. The first electrode of the second diode is coupled to a first polarity voltage source. This diode is poled to provide a low impedance path between its first and second electrodes for first polarity signals appearing at its second electrode. As a result, a low impedance path is provided at the third electrode of the switching element by the second diode when the switching element is in a nonconductive state.

Also, first impedance means is coupled between the first electrode of said second diode and the third electrode of the switching element. The impedance means provides a DC path for current flowing through the switching element when the element is in its low impedance state. Preferably, this impedance is minimized for direct current flow.

In operation, the resonant circuit has a characteristic frequency of oscillation at which energy is transferred between the reactive components therein. The voltages appearing at the first and third terminals of the resonant circuit are 180 degrees out of phase and their polarity alternates with the frequency of oscillation. When a first polarity voltage appears at the third terminal of the resonant circuit, the switching element is rendered conductive so that both the first and third terminals of the circuit are coupled to the reference potential through a low impedance path. Since the second terminal of the resonant circuit is also coupled to the reference potential, the switching element is electrically in series with the resonant circuit. Stated in other terms, when current flows into the third terminal of the circuit, current is also flowing into the first terminal. Thus, current flows from the reference potential into both terminals of the resonant circuit via the first electrode of the switching element. The electrical series circuit is completed by the coupling of the second terminal of the resonant circuit to the reference potential.

When a second polarity voltage appears at the third terminal of the resonant circuit, the switching element is nonconductive, i.e. in a high impedance state. However, the third terminal is coupled to the reference potential through the first diode. At this time, a first polarity voltage is present at the first terminal of the resonant circuit and a low impedance path is provided through the second diode and the reference voltage source to the reference potential. During this interval, the voltage at the third electrode of the switching element is maintained at the level of the first polarity voltage appearing at the first electrode of the second diode.

The square-wave output voltage of the oscillator appears at the third electrode of the switching element and its repetition rate is determined by the frequency of oscillation of the resonant circuit. The frequency stability of the present oscillator is essentially that of a conventional sine-wave LC oscillator. Since the steepness of the leading and trailing edges of the square-wave are determined by how rapidly the switching element is rendered conductive and non-conductive, the waveform of the current appearing at the third terminal of the resonant circuit is required to exhibit a rapid rate of change. The rate of change of this waveform is determined primarily by the Q of the resonant circuit. Since the present oscillator is characterized by low impedance series connections, the energy dissipated per unit time in the oscillator circuit is minimized and the resonant circuit Q enhanced.

In one embodiment of the invention, the resonant circuit comprises first and second inductors and a capacitor each of which have first and second terminals. The first terminal of the first inductor is coupled to the third electrode of the switching element. The second terminal of the first inductor is coupled to the first terminals of the second inductor and the capacitor. The second terminal of the capacitor is coupled to the reference potential and the second terminal of the second inductor is coupled to the second electrode of the switching element. Since the impedances at the second and third electrodes of the switching element are low, the resonant circuit may be considered as a capacitor shunted by two inductors. The Q of this circuit can exceed 100 so that sine wave voltages many times as large as the reference voltage appear across the capacitor. The high Q of the resonant circuit provides a current waveform at the second electrode of the switching element which has a rapid time rate of change. Thus, the current waveform is capable of rapidly switching the semiconductor element between its fully conductive and nonconductive states. Consequently, the square-wave output voltage of the present oscillator has steep leading and trailing edges.

Further features and advantages of the invention will be more readily apparent from the following detailed description of a specific embodiment thereof when viewed in conjunction with the accompanying drawings.

*Description of the preferred embodiments*

Figure 1:
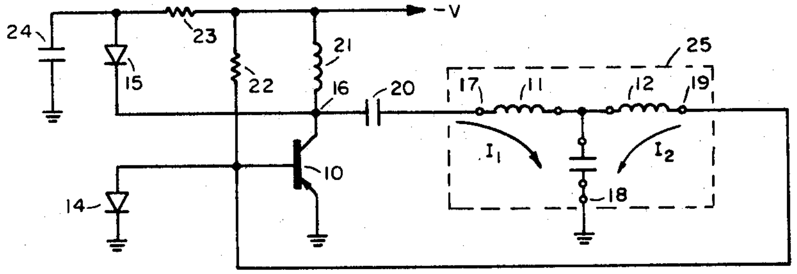
FIG. 1 is an electrical schematic diagram of one embodiment of the invention.

Referring now to FIG. 1, there is shown a square-wave oscillator comprising a PNP transistor 10 as the semiconductor switching element. The transistor has emitter, base, and collector electrodes shown in the conventional manner. The emitter is coupled to a reference potential or ground. The collector is coupled at terminal 16 to DC blocking capacitor 20. Capacitor 20 is coupled to the first terminal 17 of resonant circuit 25. The base of transistor 10 is coupled to the third terminal 19 of resonant circuit 25. The second terminal 18 of resonant circuit 25 is coupled to the reference potential.

The resonant circuit 25 contains first and second inductors 11 and 12 and capacitor 13 connected in a T configuration. In operation, the circuit is characterized by a 180 degree phase difference between voltages appearing at first and third terminals 17 and 19 which added to the 180° phase shift introduced by transistor 10 completes the feedback circuit requirement. In addition to being coupled to the collector of transistor 10, first terminal 17 is coupled through blocking capacitor 20 to the second electrode of diode 15. The first electrode of diode 15 is maintained at a constant negative voltage by biasing capacitor 24 for reasons that will later become apparent. The diode 15 is poled so that the collector of transistor 10 can not go more negative than the voltage level at the first electrode of the diode. The third terminal 19 of resonant circuit 25 is coupled to the first electrode of diode 14. The second electrode of diode 14 is coupled to the reference potential. The diode is poled to provide a low impedance path therethrough for positive signals appearing at its first electrode.

The collector of transistor 10 is coupled through shunt-feed coil 21 to a negative reference voltage source —v. The voltage source —v. is also coupled to the first electrode of diode 15 through resistor 23. A biasing capacitor 24 is connected between the first electrode of diode 15 and the reference potential. It is to be noted that voltage source —v. is coupled to the base electrode of transistor 10 through resistor 22. The conductive path between the voltage source —v. and the base of transistor 10 is provided to initiate conduction in the transistor and supply energy to resonant circuit 25. Once the oscillator is in normal operation, this conductive path is no longer utilized.

The operation of the circuit may be best described by assuming that the oscillator has been operating for a sufficient number of cycles so that the initial starting transients have been eliminated. Under these conditions, circuit 25 is in resonance with energy being alternately transferred from the inductors 11 and 12 to the capacitor 13. This energy transfer occurs at a characteristic frequency of oscillation. In the resonant condition, the currents $I_1$ and $I_2$ simultaneously flow in the directions shown in FIG. 1 during one half-cycle and are reversed in direction during the following half-cycle.

When the currents $I_1$ and $I_2$ are flowing in the direction shown, transistor 10 is in its conductive or low impedance state and first and third terminals 17 and 19 are coupled to the reference potential by the emitter of the transistor. The base-emitter junction of transistor 10 is coupled in electrical series with the resonant circuit 25. The series circuit is completed by coupling terminal 18 to ground. As a result, the base-emitter junction of transistor 10 does not constitute a shunt load for the resonant circuit and dissipation of the energy stored therein is substantially limited to the series resistance of the transistor.

Figure 2:
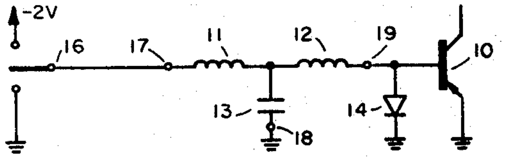
FIG. 2 is a simplified diagram illustrating the operation of the embodiment of FIG. 1.

During the following one-half cycle, the currents $I_1$ and $I_2$ are reversed in direction and transistor 10 is no longer conductive. However, first diode 14 is coupled to the base of transistor 10 and is poled to provide a low impedance path to the reference potential for current flowing out of terminal 19. Referring now to FIG. 2, terminal 19 is continually coupled to the reference potential by either diode 14 or the base-emitter junction of transistor. Terminal 16 is coupled to the reference potential by transistor 10 during one-half cycle.

During the following half-cycle, transistor 10 is nonconductive and, therefore, a different low A-C impedance path to ground is provided at terminal 16 for the current $I_1$. This conducting path includes diode 15 and the voltage source coupled to its first electrode, which in this embodiment comprises capacitor 24. However, this conducting path exhibits low impedance only during the interval when diode 15 is conductive.

When transistor 10 is conducting, the current flowing through the transistor provides the current flowing through inductance 21. At the time that the transistor is rendered non-conductive, any change in the inductor current tends to drive the voltage at terminal 16 sharply negative. However, this voltage cannot go more negative than the voltage at the first electrode of diode 15. When the diode is rendered conductive, current is supplied through this diode to the inductance. The inductance current continues to flow and maintains diode 15 conductive until transistor 10 is again driven into conduction.

During normal operation, the voltage maintained at the first electrode of diode 15 is —2 v. This voltage level may be maintained by a battery of —2 v. or, as shown in the embodiment of FIG. 1, by a combination of a resistor 23 and a capacitor 24. Assuming for the moment that a constant voltage level is maintained at the first electrode of the diode, the magnitude of this voltage can be shown to be —2 v. for stable operation from the following considerations. The voltage levels at terminal 16 are zero and some negative level. The durations at each level are equal due to the stability of the resonant circuit. In addition, the average value of the voltage at this terminal is equal to —v. since terminal 16 is coupled to the voltage source —v. through an essentially zero D-C impedance, i.e., inductance 21. Thus, the voltage levels at terminal 16 are ground and —2 v. as shown by the simplified circuit of FIG. 2.

In summary, the diode 15 is rendered conductive by the negative voltage at terminal 16 caused by the turning-off of transistor 10. The first electrode of the diode is coupled to a voltage source of —2 v. so that the voltage at terminal 16 remains essentially at —2 v. until transistor 10 is turned-on. During this interval, diode 15 is maintained conductive by the current required by the inductance 21. This current remains substantially constant during the operation of the oscillator. Since the current through diode 15 is supplied to the inductance and the current $I_1$ flows in the direction opposite to that shown by the arrow in FIG. 1, the net current through the diode is decreased by the current $I_1$.

In the embodiment of FIG. 1, the voltage —2 v. is maintained at the first electrode of diode 15 by the combination of resistor 23 and capacitor 24. The capacitor is charged continually by the flow of current from voltage source —v. through resistor 23. During the half period that transistor 10 is nonconductive, the capacitor 24 discharges and supplies the current to the inductance 21. During normal operation, the voltage across capacitor 24 remains essentially constant at —2 v. Also, the amount of charge supplied to the capacitor during a period is equal to the charge leaving the capacitor during the half-period that diode 15 is conductive.

Although the embodiment shown utilizes a capacitor coupled between diode 15 and ground, similar operation is obtained for embodiments wherein the capacitor is coupled electrically in parallel with resistor 23. In this case, the capacitor is continually supplied with charge from source —v. and discharges when diode 15 is conductive. The voltage level at the first electrode of the diode is —2 v. and the voltage across the capacitor is —v. Alternatively, the first electrode of diode 15 may be coupled directly to a battery of —2 v. and capacitor 24 and voltage source —v. eliminated.

Figure 3:
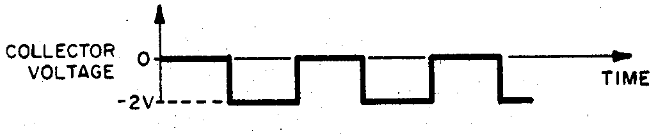
FIGS. 3 through 7 show representative waveforms for the embodiment of FIG. 1.

The voltage waveform at the collector of transistor 10, i.e., terminal 16, is shown in FIG. 3 as a square-wave varying between 0 and —2 v. with equal time durations at each voltage level. The operation of the circuit is shown in the simplified schematic of FIG. 2 wherein terminal 16 is alternately coupled to the reference potential and to a negative voltage —2 v. When the transistor 10 is nonconductive, the voltage at terminal 16 tends to go more negative than —2 v. due to the termination of the current flowing through inductance 21. However, diode 15 clamps the voltage at terminal 16 to —2 v. until transistor 10 again becomes conductive.

Figure 4:
Figure 5:
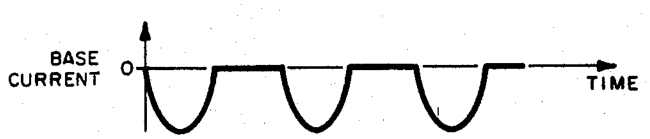
Figure 6:
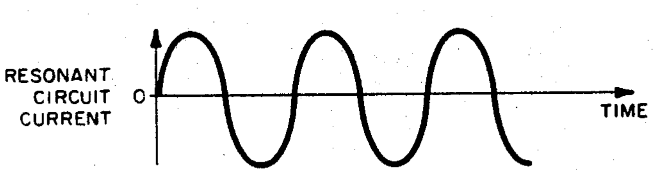

The current $I_1$ is shown in FIG. 6 while the current $I_2$ is the sum of the currents shown in FIGS. 4 and 5. FIG. 4 shows the current flowing through diode 14 and FIG. 5 shows the current flowing from the base of transistor 10. The additional 180 degree phase shift necessary to complete the oscillator feedback circuit is provided by transistor 10.

The impedances at terminals 17 and 19 are low during both half-cycles of the resonant current. Thus, the resonant circuit 25 may be considered as a capacitor shunted by two inductors. The characteristic frequency of oscillation $f_o$ of the resonant circuit is determined approximately by the following formula $$f_o=\frac{1}{2\pi\left[\frac{L_1L_2}{L_1+L_2}C\right]^{1/2}}$$

wherein $L_1$ and $L_2$ are the inductances of inductors 11 and 12 respectively and C is the capacitance of capacitor 13. The ratio of $L_1$ and $L_2$ determines the ratio of the collector current of transistor 10 to the base current and may be adjusted to minimize dissipation in the transistor for a given frequency $f_o$. In addition, it is desirable to select inductor 21 so that it is larger than inductor 11. This minimizes the flow of alternating current through inductor 21 and thereby decreases the loading of the resonant circuit 25.

Figure 7:
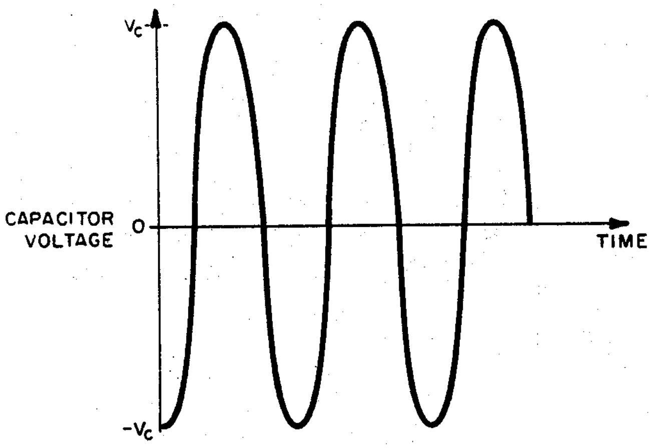

The absence of significant loading on the resonant circuit 25 decreases the power requirements of the oscillator. Further, the provision of low series impedance conducting paths decreases the energy dissipated per unit time in the resonant circuit. Accordingly, the Q of the resonant circuit is high so that a sine wave voltage of many times the magnitude of the reference voltage appears across capacitor 18. This voltage is shown in FIG. 7.

The frequency stability of the oscillator is essentially that of a sine wave L-C oscillator. The rapid switching of the transistor 10 by the current $I_2$ insures that the square-wave at terminal 16 has sharp leading and trailing edges. The current switching the transistor is shown in FIG. 5 and is sinusoidal with a relatively large magnitude. Thus, transistor 10 is rapidly driven into saturation.

In a typical circuit, the values of the components are as follows:

| | | |
|---|---|---|
| Diodes **14** and **15** | | Type 1N279 |
| Transistor **10** | | Type 2N782 |
| Inductors **11** and **12** | μh | 100 |
| Inductor **21** | mh | 1 |
| Capacitor **13** | pf | 39 |
| Capacitor **24** | μf | 0.1 |
| Capacitor **20** | μf | 0.01 |
| Resistor **22** | KΩ | 2.7 |
| Resistor **23** | Ω | 150 |
| Voltage source —v. | v | 2.5 |

The square wave output signal at terminal 16 varied between 0 and —5 volts with a period of 0.3 μsec. between successive leading edges of the output waveform. The sinusoidal voltage appearing across capacitor 18 was 100 volts peak to peak. The resonant circuit current $I_R$ was 40 ma. peak to peak.

While the above description has referred to a specific embodiment of the invention, it will be recognized that many variations and modifications may be made therein without departing from the spirit and scope of the invention.

What is claimed is:

1. A square-wave oscillator comprising (a) a semiconductor switching element having first, second and third electrodes, said first electrode being coupled to a reference potential, said element being rendered conductive by the application of a first polarity signal to said second electrode;

(b) a first diode having first and second electrodes, said diode being poled to provide a low impedance path between its first and second electrodes for second polarity signals appearing at said first electrode, the first electrode of said diode being coupled to the second electrode of said switching element, said second electrode of said diode being coupled to said reference potential;

(c) resonant circuit means having first, second, and third terminals, said first and third terminals being coupled to the third and second electrodes respectively of said switching element and said second terminal being coupled to said reference potential, said resonant circuit having a characteristic frequency of oscillation, a first polarity signal appearing at the third terminal of said circuit rendering said switching element conductive whereby the first and third terminals of said circuit are coupled to the reference potential, third terminal of said circuit being coupled to the reference potential through said first diode when a second polarity signal appears at the third terminal;

(d) a second diode having first and second electrodes, said second electrode of said second diode being coupled to the third electrode of said switching element, said first electrode of said second diode being coupled to a first polarity voltage source, said diode being poled to provide a low impedance path between said first and second electrodes for first polarity signals appearing at said second electrode;

(e) first impedance means having first and second terminals, said first terminal of said impedance means being coupled to the third electrode of said switching element, said second terminal of said impedance means being coupled to the first electrode of said second diode; and (f) means for applying a first polarity voltage to the first electrode of said second diode.

2. The oscillator of claim 1 further comprising DC blocking means connected between the third electrode of said switching element and the first terminal of said resonant circuit means.

3. The oscillator of claim 2 in which said resonant circuit means comprises:

(a) a first inductor having first and second terminals, said first terminal of said first inductor being coupled to said blocking means;

(b) a second inductor having first and second terminals, said first terminal of said second inductor being coupled to the second terminal of said first inductor, said second terminal of said second inductor being coupled to the second electrode of said switching element; and (c) a capacitor having first and second terminals, said first terminal of said capacitor being coupled to the first terminal of the second inductor, said second terminal of said capacitor being coupled to the reference potential.

4. The oscillator of claim 3 in which said semiconductor switching element is a transistor and said first, second and third electrodes are the emitter, base, and collector electrodes respectively.

5. The oscillator of claim 4 in which said first impedance means comprises (a) a first resistor having first and second terminals, said first terminal of said first resistor being coupled to the first electrode of said second diode, (b) a third inductor having first and second terminals, said first terminal of said third inductor being coupled to the second terminal of said first resistor, said second terminal of said third inductor being coupled to the third electrode of said transistor, said first terminal of said third inductor being coupled to the first polarity voltage source, and in which said means for applying a first polarity voltage comprises a biasing capacitor coupled between the first electrode of said second diode and a reference potential, said capacitor providing a first polarity voltage at said first electrode of said second diode having twice the magnitude of the first polarity voltage of said source.

6. The oscillator of claim 5 in which said biasing capacitor is coupled between the first electrode of said second diode and the reference potential.

7. The oscillator of claim 5 in which the inductance of said third inductor is about 10 times that of said first inductor.

8. The oscillator of claim 5 in which the inductance of said second inductor exceeds that of said first inductor.

9. The oscillator of claim 5 further comprising a resistor having first and second terminals, said first terminal of said resistor being coupled to said voltage source, said second terminal of said resistor being coupled to the second electrode of said transistor.

References Cited

UNITED STATES PATENTS 3,155,921 11/1964 Fischman ---------- 331—117

ROY LAKE, *Primary Examiner.*

S. H. GRIMM, *Assistant Examiner.*